United States Patent [19]

Mahig

[11] 4,215,280

[45] Jul. 29, 1980

[54] PHASE RESPONSIVE FREQUENCY DETECTOR

[76] Inventor: Joseph Mahig, 701 SW. 91st St., Gainesville, Fla. 32601

[21] Appl. No.: 939,048

[22] Filed: Sep. 1, 1978

[51] Int. Cl.² .......................... H03K 1/16; H03K 3/72
[52] U.S. Cl. .............................. 307/295; 307/233 R; 328/138; 324/83 D; 324/78 F
[58] Field of Search .......................... 307/295, 233 R; 328/138, 140; 324/78 F, 83 D

[56] References Cited

U.S. PATENT DOCUMENTS

| | | | |
|---|---|---|---|
| 3,183,449 | 5/1965 | Bray | 307/295 |
| 3,381,220 | 4/1968 | Burr | 328/55 |
| 3,539,828 | 11/1970 | Crouse | 307/233 |
| 3,543,172 | 11/1970 | Seppeler | 328/140 |
| 3,564,441 | 3/1968 | Eide | 330/109 |
| 3,721,913 | 3/1973 | Theobald | 307/233 |
| 3,912,917 | 10/1975 | Nussbaumer | 235/156 |
| 3,976,958 | 8/1976 | Seidel | 328/167 |
| 3,988,606 | 10/1976 | Eggermont | 235/156 |

Primary Examiner—Alfred E. Smith
Assistant Examiner—Thomas P. O'Hare
Attorney, Agent, or Firm—Dowell & Dowell

[57] ABSTRACT

A detector for detecting the presence of selected frequency components of an input signal and operative to deliver output responsive thereto by providing two separate signal paths in the detector, at least one path including filter circuitry having a distinct cross-over point operative to pass frequencies on one side of the cross-over point with one phase relative to the input and to pass frequencies on the other side of the cross-over point substantially 180° out of phase relative to the input, and the detector further including a coincidence circuit receiving the signals from the two paths and generating one level of output for signals which are substantially in phase and generating another lower level of output for signals substantially out of phase. The coincidence circuit may have provisions for establishing an input threshold level which the signals must overcome.

13 Claims, 7 Drawing Figures

PHASE RESPONSIVE FREQUENCY DETECTOR

FIELD OF INVENTION

This invention relates to frequency detectors, and more particularly relates to detectors which use filter circuits to selectively shift the phases of frequency components of a signal differently on two different signal paths, and the detector being operative to detect the presence of selected frequencies by comparing phases of the frequency components of the signal in each path.

BACKGROUND AND PRIOR ART

The prior art includes various methods for detecting the presence of a given frequency or band of frequencies in a composite signal. Pass filters typically used for this purpose include both passive RLC circuits and active RC circuits using operational amplifiers such as is shown in Eide U.S. Pat. No. 3,564,441. These filters, by themselves, usually have poor cut-off characteristics even when cascaded with each other. Other filter systems are made by inserting phase shifter circuits and then summing and differencing the output signals as suggested in Seidel U.S. Pat. No. 3,976,958 in order to achieve better sensitivity under some circumstances. Another circuit using phase shifting and summing to provide sharper detection is shown in Theobald U.S. Pat. No. 3,721,913. U.S. Pat. No. 3,381,220 to Burr shows a detection circuit using phase shifting plus digital detection techniques. Digital filter circuits which are useful in the present detector are shown in U.S. Pat. No. 3,912,917 to Nussbaumer, and in U.S. Pat. No. 3,988,606 to Eggermont.

SUMMARY OF THE INVENTION

The frequency detector circuits according to the present invention comprise two separate wave paths connected to a common input at one end and to a comparator at the other. At least one of the separate wave paths includes a pass filter, and where pass filters are used in both paths their cross-over frequencies are made different. Ideally, the frequency or frequencies to be detected will have their phases shifted 180° by the filter means in one path as compared with the frequency or frequencies traversing the other path, although in practice the phase shift will only approach 180° near the cross-over frequency of each path filter, dependent on the Q achievable with each filter.

The present detector comprises a filter in either one or both of the paths, either low pass, high pass or band pass. When there is a filter in only one path, for example in the case where a frequency detector has a low pass filter in that path, frequency components of the signal which are transferred below cross-over will be almost unshifted in phase as compared with frequencies transferred above cross-over whose phases will be shifted about 180°. The frequency components in the two paths will be about 180° out of phase at the outputs for frequencies above cross-over, but will be substantially in phase for frequencies below cross-over. A coincidence detecting circuit is connected to the output of both paths, and the coincidence circuit will provide output indicating phase coincidence for frequencies below the cross-over, but not for frequencies thereabove. Where there is a filter in only one path and that filter is a high pass filter, the coincidence circuit will provide output only for frequencies above the cross-over frequency of the filter. If a high pass filter is used in one path and a low pass filter in the other path and their cross-over frequencies are spaced apart with the cross-over of the low pass filter above the cross-over of the high pass filter, then frequencies within the pass band between the cross-over points will have like polarities in the two paths and will cause the coincidence circuit to deliver an output. The parameters of the filters can always be selected so that the frequency components of the signal above and below the pass band will be mutually phased so that they will not cause the coincidence circuit to generate a signal. Band pass filters can be used in both paths provided their cross-over frequencies are offset one from the other and provided their phase shifts for a particular frequency will be different in the two paths.

It is the object of this invention to provide a frequency detector according to the present invention which can achieve extremely sharp frequency discrimination, which will be relatively insensitive to noise, and which can respond rapidly to the presence of a selected frequency.

It is another object of the invention to provide a frequency detector or filter which is inexpensive to make, and which lends itself to being made up of RC circuits and operational amplifiers, including integrated circuits in the coincidence circuit.

It is a further object of the invention to provide a detector which is well adapted for use as a demodulator for binary data which is transmitted by frequency shift keying. The circuit is capable of detecting small frequency shifts, both at very low frequencies as well as at frequencies extending into the megahertz region. It will also detect the presence of a frequency component in a rapidly varying composite signal having a very narrow bandwidth, with high attenuation outside this region. It is an important feature of the invention that the coincidence circuit can use AND gate type circuitry of the type having a threshold level which must be exceeded in both of the separate detector paths before a coincidence output will be achieved. This feature can be used to reduce sensitivity to spurious outside signals.

Another major feature of the invention is that both positive and negative AND circuitry can be employed so that outputs occur for both half cycles of the two signals being compared for phase coincidence, so that no information need be lost.

It is another object of the invention to provide a detector circuit in which digital filters can be used in place of analog filters to achieve the necessary phase shifts.

Still another feature of the invention is that the filters in the wave paths do not have their Q's lowered by loading, such loading having been minimized by using F.E.T. coupling circuits whereby to make the phase shift of the filter in the vicinity of cross-over approach 180° as nearly as possible. It is not necessary that the attenuation along both wave paths be identical, or that the circuits be lossless. However, in order to achieve an output from the coincidence detector it is necessary that the instantaneous amplitudes of similarly phased components exceed the threshold levels of the AND gates in the coincidence circuit, and that the amplitudes of the similarly phased components be relatively dominant as compared with the instantaneous amplitudes of all other components. Although such dominance will always occur, its occurrence may occupy only a short period of time.

Other objects and advantages of the invention will become apparent during the following discussion of the drawings:

DESCRIPTION OF PREFERRED EMBODIMENTS

It is well known that there are a number of different types of electrical wave filters which have a cross-over frequency, and that these filters in the vicinity of cross-over shift the phase of signals passing through the filter by substantially 180°. Good examples of analog filters of this type are shown in the "Handbook of Operational Amplifier Active RC Networks", Burr-Brown Research Corporation, Copyright 1966, which shows low-pass, high-pass and band pass filter circuits which are used in the illustrative embodiments of this disclosure. An active RC low-pass filter of this type having a given cross-over frequency will pass signal frequency components just below the cross-over frequency substantially without shifting phase, but will pass attenuated higher frequencies located above the cross-over frequency with a substantially 180° phase shift. How close this 180° shift is to the cross-over point depends upon the Q of the filter, which can be variably adjusted in the circuitry chosen. The present invention uses the fact that frequency components of the signal passing through such a filter can be made to have substantially opposite phases on opposite sides of the filter's cross-over frequency. This fact is used to select one or the other of these frequencies, or band of frequencies, by passing the unshifted input frequencies together with the shifted output of the filter to an AND gate, or to several AND gates, which serve as coincidence circuits delivering an output signal whenever the arriving components are in phase with each other.

Figure 1:
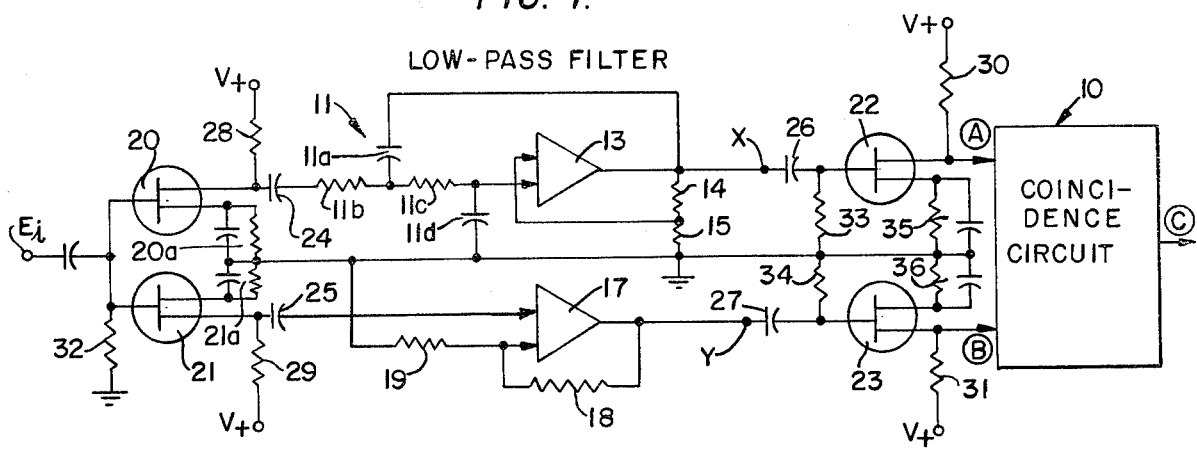
FIG. 1 is a schematic diagram of a frequency detector according to the present invention using a low pass filter.

Referring now to FIG. 1, this figure shows a preferred embodiment of a coincidence circuit 10 receiving output from two separate signal paths, one path including a low pass filter which is of a known type. The parameters of the active filter circuit itself can be easily selected and adjusted to achieve a high Q using low precision components in a manner well known in the prior art. The input signal $E_i$ may comprise a signal whose frequency can be shifted to provide different frequencies around a carrier frequency. An example of this type of input would be the signal received by a frequency shift keying (FSK) communications receiver. This signal would have a central carrier frequency from which the frequency is displaced in one or both directions when the transmitter is keyed. The circuit shown in FIG. 1 would be useful to detect a shift in frequency from the carrier frequency in a single direction. In this instance, the cross-over frequency of the filter would be located between the carrier frequency and the frequency to which the carrier is shifted when the transmitter is keyed.

The filter in this illustrative embodiment comprises an RC low pass network 11 connected into the amplifier 13 and including a feedback capacitor 11a, two series resistors 11b and 11c, and a shunt capacitor 11d. The output of the RC network 11 is fed into one input to the amplifier 13. The amplifier has its other input provided with feedback from a feedback circuit, in this case including resistors 14 and 15. According to a typical example given in the Burr-Brown Research Corporation Handbook, mentioned above, such a low pass filter has a cross-over frequency of 30 Hz when the following values are used: Resistor $11b = 75$ Kohms, resistor $11c = 3.94$ Kohms; capacitor $11a = 0.10$ microfarads; combined resistors $14 + 15 = 100$ Kohms (potentiometer); and capacitor $11d = 0.95$ microfarad.

The network 11 and the amplifier 13 comprise the upper signal path of a two path circuit, the lower path comprising an amplifier 17 which is similar to the amplifier 13, a feedback resistor 18 for setting the gain, and a series resistor 19 for current limiting purposes. The signal input to the upper and lower paths of the circuit is coupled through FET amplifiers 20 and 21, and the outputs from the respective paths are coupled by FET amplifiers 22 and 23 to avoid loading the filter and reducing its Q. As is well known in the prior art, suitable DC blocking capacitors 24, 25, 26 and 27 are inserted, and the amplifiers are provided with load resistors 28, 29, 30 and 31, and with suitable resistors 32, 33 and 34 holding down their gates. The output amplifiers 22 and 23 are provided with conventional capacity by-passed self-biasing means 35 and 36 on their sources, and the input amplifiers are similarly self-biased by means 20a and 21a.

Figure 2:
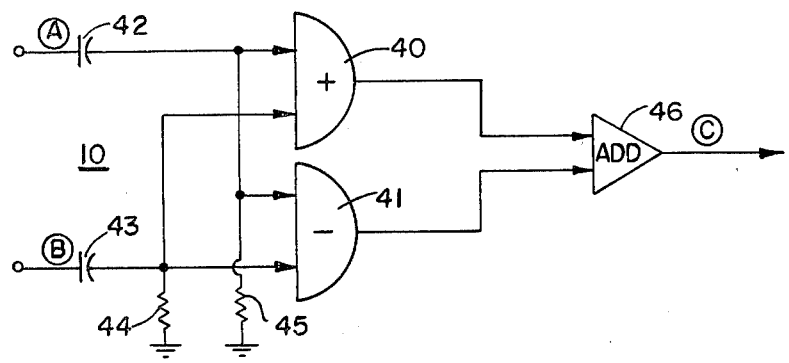
FIG. 2 is a schematic diagram of a coincidence circuit using an AND gate and a NAND gate.
Figure 6:
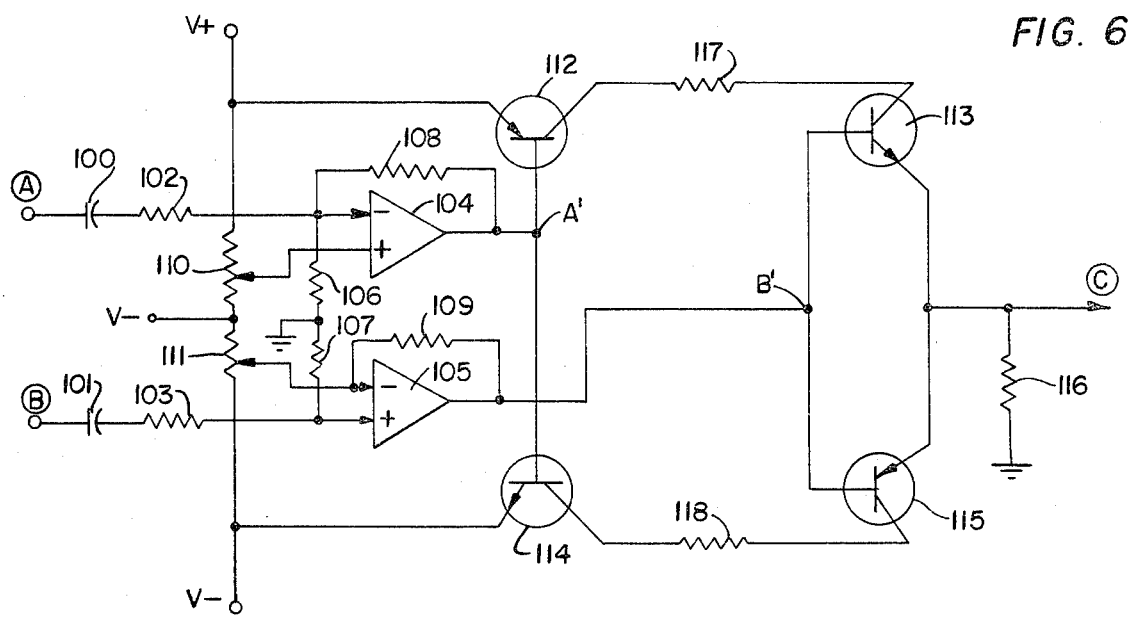
FIG. 6 is a schematic diagram of a modified form of coincidence circuit.

As mentioned above, the detector circuit has two paths, the upper path being the low pass filter just described, and the lower path comprising the operational amplifier 17, inserted to keep the upper and lower paths more nearly identical. The output of the filtered upper path is labelled A, and the output of the unfiltered lower path is labelled B, and these outputs are fed into a coincidence circuit 10, more detailed examples of which are shown in FIGS. 2 and 6, described below. The desired relative phase relationship of the two output signals in paths A and B for a particular input can be pre-selected by suitably reversing the inputs to the amplifier 17 so that it either passes the signal in the lower path inverted or uninverted.

When an input signal $E_i$ is inserted in the upper path A, a signal component whose frequency is above the cross-over frequency will have the opposite phase at the output of the filter path A from a signal component passing through the same filter below the cross-over frequency. The components below the cross-over frequency are substantially in phase with the output signal components of the same frequency in path B, assuming that the operational amplifiers 13 and 17 have transfer functions of the same sign. Therefore, the output of the filter in path A is in phase with the output in path B for frequencies below cross-over, but opposite in phase for frequencies above the cross-over frequency.

The coincidence circuit of FIG. 1 can take various forms, for instance the form of the circuit shown in FIG. 2, or in FIG. 6. The FIG. 2 circuit comprises AND gates 40 and 41, coupled by capacitors 42 and 43 and resistors 44 and 45 to the outputs of the amplifiers 22 and 23. Gate 40 is an AND gate which responds by delivering output when the signals in paths A and B have positive coincidence, whereas, gate 41 is a NAND gate which responds to coincidence between negative going signals arriving from the paths. The outputs from both gates 40 and 41 are positive when coincidence is detected, and therefore their outputs are summed in an ADD circuit 46 delivering an output C for coincident signals of either input polarity. The gates 40 and 41 may comprise mere diode circuits of well known type, or integrated TTL chips of the series SN7400, or MOS-FET series CD4000 chips, etc. In the latter case, the FET amplifiers 22 and 23 could be eliminated since the MOSFET gates would not load the paths A and B. The alternative coincidence circuitry of FIG. 6 will be discussed hereinafter.

The use of such binary gates as are commonly used in digital circuits produces an additional useful characteristic for any of the detector circuits disclosed herein. This useful effect is attributable to the fact that the AND or NAND gates all have a threshold of sensitivity at their inputs, which threshold requires the appearance of an input signal exceeding a certain amplitude in order to provide an output from the gate. For instance, in the TTL chips of the SN7400 series, where the chip has a supply voltage of 5 volts, the threshold of the input signals required to provide an output from the gate is about 2.8 volts. Thus, if a gate is used having such a threshold, the output from the low pass filter must reach at least this level in order to achieve coincidence in the AND gates. As a result, this type of system when used as a frequency detector tends to filter out noise components and other perturbations, and provide a sharply defined output from the summing circuit 46 only when a strong coincidence is detected by the gates 40 and 41. This threshold characteristic would be desirable in a coincidence filter circuit as shown in the present disclosure when used as a detector for a frequency shift keying signal.

The principal of operation of a circuit as shown in FIG. 1 can be illustrated as follows. As input signal Ei is channeled into the two different paths of the circuit shown in FIG. 1, the paths being labelled A and B. The signal in path B merely passes directly through amplifier 17 to the two gates 40 and 41. The inverting effects of the amplifiers 20 and 21 are cancelled by the inverting effects of the amplifiers 22 and 23, respectively. Conversely, the signal in path A travels through the low pass filter 11. For components below the cross-over frequency, the output signal in path A is not inverted relative to the signal in path B, but for components whose frequency is above the cross-over frequency, the output is substantially inverted. As a result, when the signals in paths A and B are fed to the coincidence circuit 10, components of frequency below the cross-over point will be in phase and coincidence will be detected, so that the output of the summing amplifier 46, FIG. 2 will be a high signal. For components above the cross-over frequency of the filter, the components in paths A and B will be 180° out of phase so that no coincidence will be detected. The input signal Ei may not be a single carrier frequency, but may have different frequency components present so that the output of the filter includes both components of interest near the cross-over frequency and other components having random phase relationships. At times when the components of the signal near the cross-over point are very small in amplitude, random components may temporarily obliterate them in the output signal $E_o$. At these times, the gates 40 and 41 will tend to provide zero output. Conversely, at times when components just below the cross-over point sufficiently exceed the level of the random components, the gates 40 and 41 will detect coincidence, respectively during positive and negative half cycles of the input signal, whereby the summing circuit 46 will provide a continuous high output as long as this condition persists. It is to be noted that the effect of the low pass filter in path A is not only to shift the phase of the components having frequencies above the cross-over point, but it is also to attenuate the amplitude of those components. Therefore, the low pass filter will tend to discriminate against the higher frequency components not only because of phase displacements thereof, but also by reason of attenuation of the high frequency components. As a result the circuit of FIG. 1, when used as a detector for FSK signals, will produce a binary one output in the presence of a frequency shifted below the cross-over frequency and a binary zero in the presence of a frequency shifted above the cross-over frequency.

Figure 3:
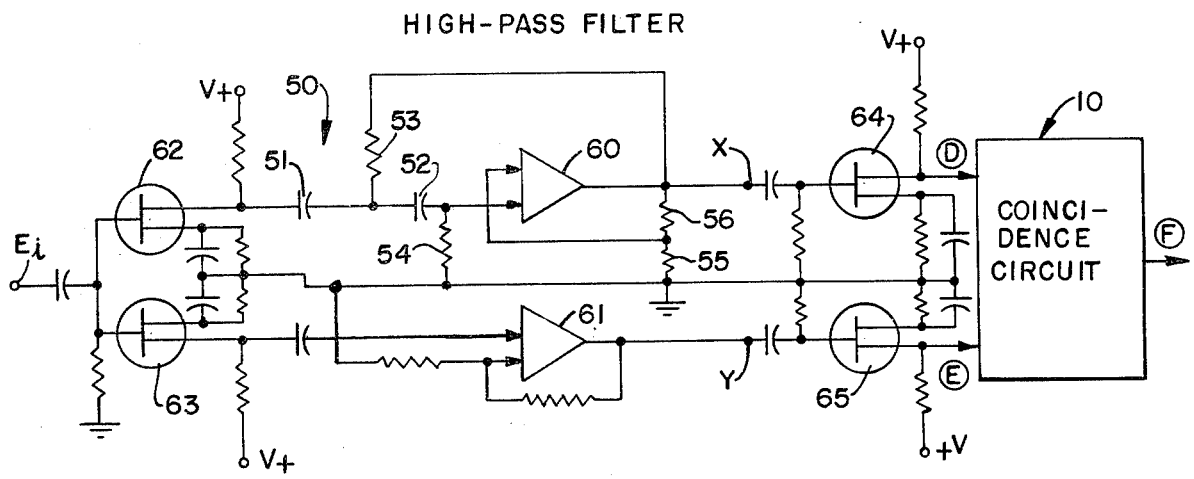
FIG. 3 is a schematic diagram of a frequency detector similar to FIG. 1 but using a high pass filter.

FIG. 3 shows an active filter circuit located in an upper path D which resembles the circuit shown in FIG. 1 except that it is a high pass filter 50 comprising an amplifier 60 having one terminal fed by a high pass filter network including capacitors 51 and 52, a feedback resistor 53 and a shunt resistor 54. The other input to the amlifier 60 is from a voltage divider 55 and 56 which may comprise a potentiometer. The lower path E is simliar to the lower path in FIG. 1 and comprises an operational amplifier 61 which is included to make the two paths more similar. The FET amplifiers 62 and 63 feed the two paths with the input signal Ei, and the amplifiers 64 and 65 deliver output to the coincidence circuit 10 without loading the paths since they are also FET amplifiers. The coupling and by-pass capacitors, and the bias and load resistors of the amplifiers 62, 63, 64 and 65 are similar to those described in connection with FIG. 1.

The phase shift effect on the input signal Ei by the high pass filter 50 is opposite to that attributable to the low pass filter 11 shown in FIG. 1, i.e. the signal frequencies just above the cross-over frequency of the filter 50 in path D are passed substantially without phase shift relative to the output in path E, but the frequency components just below the cross-over frequency are shifted about 180°. Whenever frequency components of the input signal Ei which are near the cross-over frequency dominate the other components, assuming that their amplitudes are sufficient to operate the coincidence circuit 10, then for frequency components of the input signal Ei above the cross-over frequency which travel through the high pass filter 50 and appear at the input D of the coincidence circuit 10, their phase will be substantially unshifted relative to the output at E. However, frequency components whose frequencies are below the cross-over will appear at the output of signal path D with a phase shift of about 180° relative to path E, assuming that the operational amplifiers 60 and 61 have transfer functions of the same sign. Consequently, the coincidence circuit 10 will deliver a binary high output signal at F whenever the frequency of the dominant signal component is above the cross-over frequency, and will deliver a binary low output whenever the frequency of the dominant component falls below the cross-over frequency. Thus, if this filter were used as an FSK detector it would provide a binary one output at the terminal F for FSK signals which are shifted above the cross-over frequency of the high pass filter 50, but would provide binary zeros for FSK signals shifted below the cross-over frequency. The above mentioned Burr-Brown Research Corporation Handbook shows, as an example, that for a cross-over frequency of 300 Hz the resistor 53 should be 39.3 Kohms; the capacitors 51 and 52 should be 0.10 microforads; the resistor 54 should be 717 ohms; and the potentiometer comprising the resistors 55 and 56 should be 100 Kohms.

Figure 4:
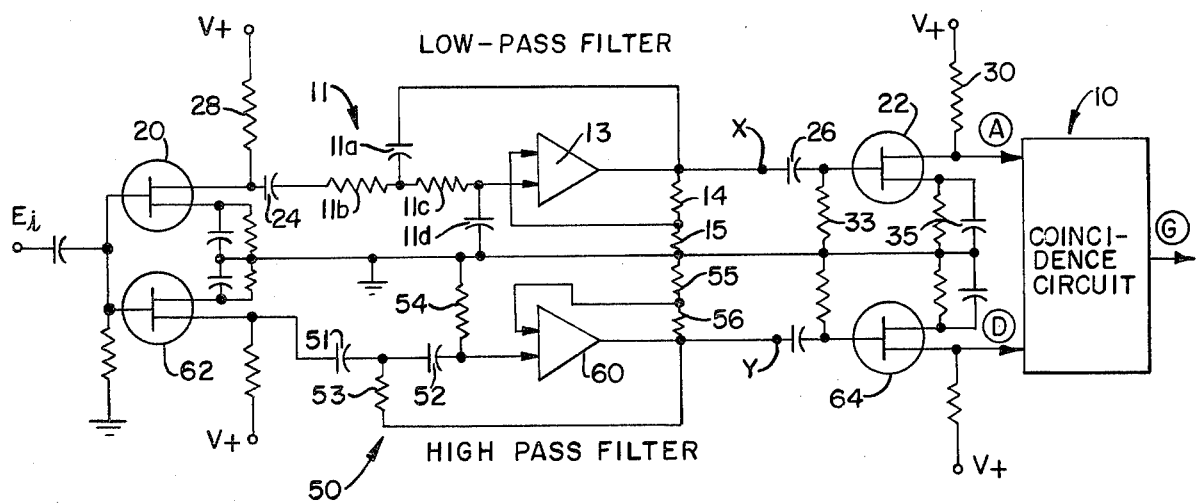
FIG. 4 is a schematic diagram of a frequency detector using the combination of a low pass filter in one signal path and a high pass filter in the other path.

FIG. 4 shows a band pass filter made up of two different types of filters, one comprising in path A a low pass filter 11 as shown in FIG. 1, and the other comprising in path D a high pass filter 50 as shown in FIG. 3. The low pass filter 11 has its cross-over frequency coincident with the upper frequency intended for the pass characteristic for the over-all the detector circuit of FIG. 4. The high pass filter has its cross-over frequency coincident with the lower frequency intended for the pass characteristic for the over-all detector circuit of FIG. 4. Said over-all pass characteristic lies between the two cross-over frequencies. The low pass filter 11 will pass the frequencies located below its cross-over frequency without phase shift relative to the output in the other path. Likewise, the high pass filter 50 will pass, without phase shift relative to the output in the other path, those frequencies located above its cross-over frequency, whereby there will be a pass band located between these two cross-overs. For components of frequency located between the two cross-over frequencies there will appear in both branches A and D signals which are in-phase and which are delivered to the coincidence circuit 10, these signals being substantially unshifted relative to the input signal $E_i$. Therefore, circuit 10 will find coincidence during the respective positive and negative half cycles of these components and a binary high output will appear at G, FIG. 4. Conversely, the low pass filter 11 will attenuate frequencies above the cross-over frequency and will phase shift them to lag, whereas the high pass filter 50 will attenuate frequencies below cross-over frequency and will shift them to lead. The parameters of these filters in FIG. 4 should be chosen to provide a 180° phase shift, lag or lead, for these respective filters so that there will be no coincidence above the low pass cross-over frequency and no coincidence below the high pass cross-over frequency, whereby a band pass detector is provided.

It should be noted that a workable coincidence detector can be achieved by using only one of the two gates 40 and 41 shown in FIG. 2 and eliminating the summing amplifier 46. Such a simplified coincidence circuit will provide performance in which coincidence will be detected during only one or the other of the half cycles of each period of the wave. In other words, the single AND gate can be made responsive either to positive coincidence from the signals passing through the two separate paths, or responsive to negative coincidence. This type of circuit does, however, provide an output which can be smoothed to provide an alternating wave corresponding in frequency with the frequency of the components which are detected to be coincident.

Figure 5:
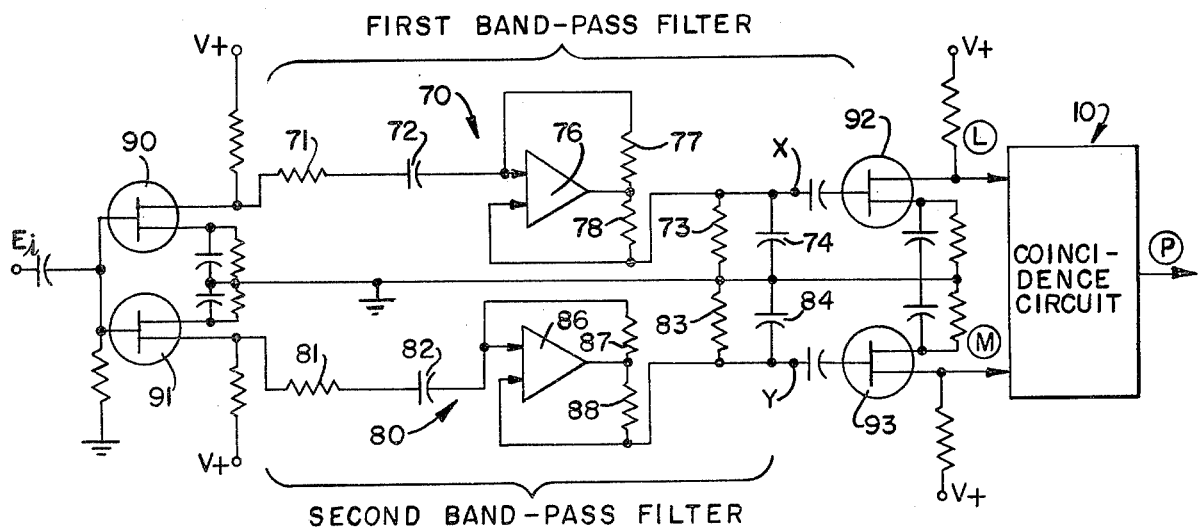
FIG. 5 is a schematic diagram of a frequency detector using a first band pass filter in one signal path and a second band pass filter in the other path, the filters having their crossover frequencies somewhat offset one from the other.

FIG. 5 shows a preferred embodiment of the detector circuit which has two similar band pass filters in the two signal paths. The first band pass filter 70 includes an input RC circuit comprising a series resistor 71 and capacitor 72 and an output RC circuit comprising a shunt resistor 73 and capacitor 74. The RC circuits are connected by an operational amplifier 76 having its output connected to voltage divider resistors 77 and 78 respectively providing feedback to the two input terminals of the amplifier. The second band pass filter 80 in the other signal path likewise includes an input RC circuit comprising a series resistor 81 and capacitor 82, and a shunt RC circuit including the resistor 83 and capacitor 84. These RC circuits are connected by an operational amplifier 86 having its output connected to voltage divider resistors 87 and 88 respectively providing feedback to the two input terminals of the amplifier. The resistor dividers can be replaced by potentiometers which the Burr-Brown Research Corporation Handbook suggests should have a value of 25 Kohms, with the wiper set about one-third of the way up from the bottom to achieve about the correct grain to provide a Q of 100. The handbook gives a typical example in which the cross-over frequency will be 80 Hz when resistors 71 and 73 equal 19.9 Kohms and the capacitors 72 and 74 are selected to be 0.1 microfarad.

As is described in greater detail in FIG. 1, the input signal Ei is applied to the two signal paths through FET amplifiers 90 and 91 connected similarly to those shown in FIG. 1. The outputs of the two band pass filters 70 and 80 are connected by FET amplifiers 92 and 93 to the input terminals L and M of the coincidence circuit 10 which then provides an output at K which is high when coincidence is detected. The second band pass filter 81, 82, 83, 84, 86, 87 and 88 is similar to the first band pass filter 70 except that its cross-over frequency should be slightly offset. This can be done conveniently by changing the values of the resistors 81 and 83, although changing the capacitor values at 82 and 84 would do as well. When this is done the cross-over of the second filter will differ from that of the first filter, whereby the phase shift of one filter with respect to the phase of Ei will be displaced in relation to the phase shift of the other filter so that between the two cross-overs there will be a zone of non-coincidence which the circuit 10 will detect.

It will be noted that in FIGS. 1, 3, 4 and 5 there is a point marked X in the upper path, and a point marked Y in the lower path. In each of these figures if the circuit is broken either at X or at Y and an inverter inserted therein, the response characteristic of the circuit will be thereby reversed from the characteristic discussed. In FIG. 1, coincidence will be had for frequencies above the cross-over. In FIG. 3, coincidence will be had for frequencies below the cross-over. In FIGS. 4 and 5, by the appropriate insertion or omission of an inverter in one path, the circuits can be selectively altered to act either as band pass or as band-elimination filters as may be desired.

FIG. 6 shows a modified coincidence circuit which can be used as the coincidence circuit 10 in any of the embodiments of FIGS. 1, 3, 4 or 5. It has two inputs labelled A and B connected by blocking capacitors 100 and 101 and coupling resistors 102 and 103 to respective ones of the inputs of two operational amplifiers 104 and 105. The input to one terminal of the amplifier 104 is returned to ground level by a resistance 106, and likewise the input to one terminal of the other amplifier 105 is returned to ground by a resistance 107. The gain of the amplifiers 104 and 105 is established by feedback resistors 108 and 109. The bias levels on the non-signal inputs to the amplifiers 104 and 105 are established by adjustment of potentiometers 110 and 111, which are respectively preset to establish the zero signal balance of the amplifiers. The PNP transistor 112 and the NPN transistor 113 comprise a positive signal coincidence AND gate, corresponding in function with the gate 40 in FIG. 2. The NPN transistor 114 and the PNP transistor 115 comprise a negative signal coincidence NAND gate, corresponding in function with the NAND gate 41 in FIG. 2. If the signals on both inputs A and B are simultaneously positive, the output B' of amplifier 105 will be positive. At the same time the output A' of amplifier 104 will be negative because the input to that amplifier from the A path is connected to its inverting terminal. A positive signal at B' and a negative signal at A' will turn on both the transistors 113 and 112 respectively, thereby drawing current from the V+ supply through the load resistor 116 and providing a positive output signal at C for the duration of the positive coincidence. The transistors 114 and 115 are biased off.

Conversely, if both inputs A and B are negative, the output B' of the amplifier 105 will be negative, but the output A' of the amplifier 104 will be positive because the input to that amplifier is connected to its inverting terminal. A negative signal at B' and a positive signal at A' will turn on the transistors 115 and 114 respectively, thereby drawing current from the negative V supply through load resistor 116 and providing a negative output signal at C for the duration of the negative coincidence. The transistors 112 and 113 are biased off.

The resistors 117 and 118 are inserted to limit the drive current to the collectors of the transistors 113 and 115.

If the inputs A and B are different, one positive and the other negative, then no current will be drawn through either the upper pair or the lower pair of transistors because at least one of them in each pair will always be biased off. The coincidence circuit of FIG. 6 is useful in applications where it is desirable for positive coincidence to deliver positive output at C and negative coincidence to deliver negative output at C.

It will be recognized that the particular analog pass filters shown in the various specific embodiments described hereinabove are mainly illustrative and that other means of obtaining the desired phase shift characteristic in each wave path can be readily employed. Since transversal and/or recursive filters can be combined to provide a digital filter which is capable of simulating any of the analog filter representations described above to any accuracy, a digital filter can be employed in one or both wave paths. The procedure for designing a digital filter is well known to those familiar with the art, and is described in the book "ACTIVE FILTERS LUMPED, DISTRIBUTED, INTEGRATED, DIGITAL AND PARAMETRIC" by Kerwin, Leon et al, edited by L. Huelsman, (pp 200–279). Examples of digital filter representations of analog low pass filters are shown on pp 258–267.

Figure 7:
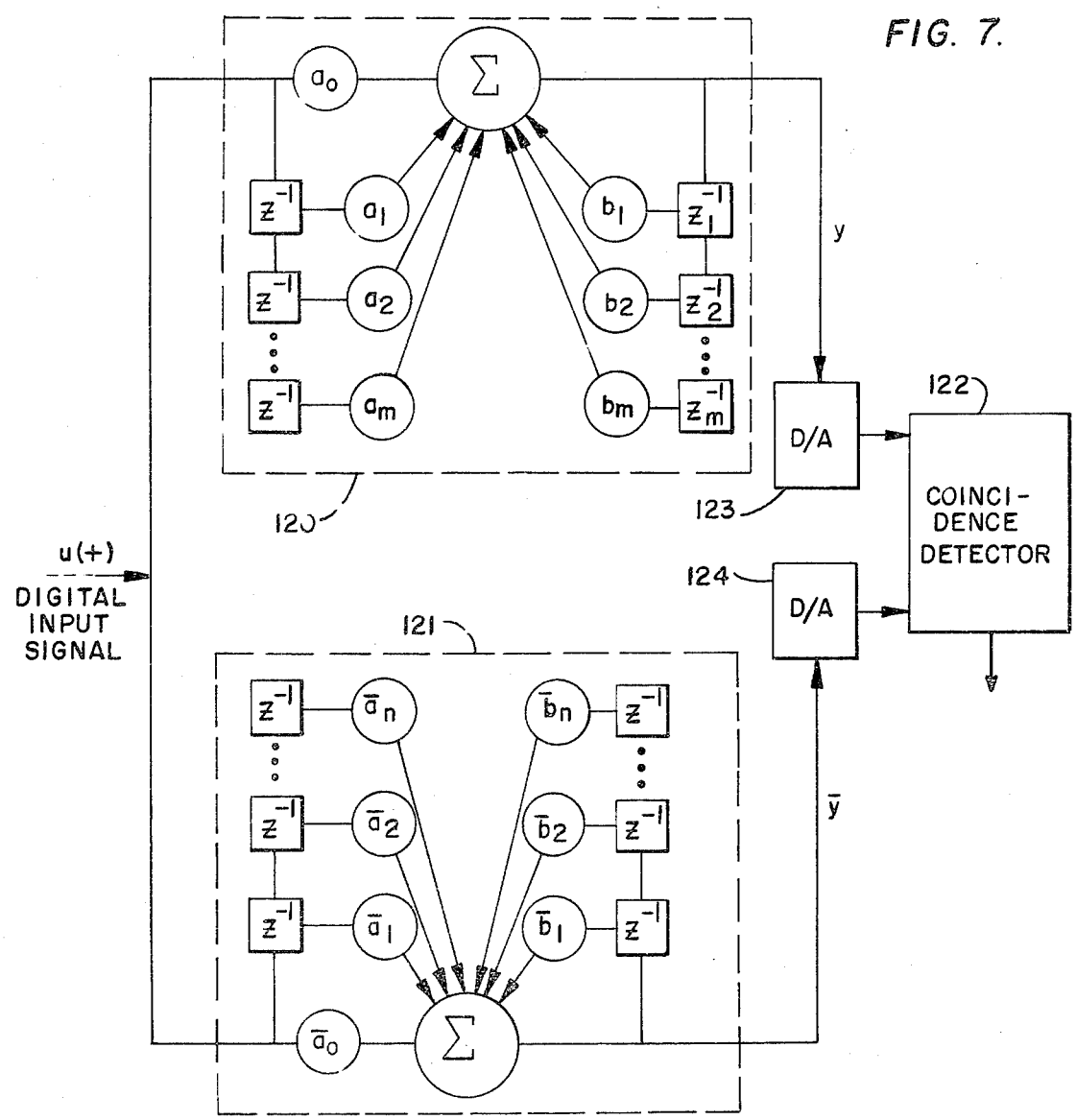
FIG. 7 is a block diagram showing a frequency detector having a coincidence circuit fed by two different signal paths each including digital filter means those characteristics are determined by the choice of the coefficients a, $\bar{a}$, b and $\bar{b}$.

In the digital embodiment shown in FIG. 7, the filters on both wave paths y and ȳ are digital filters whose phase cross-over frequency in each wave path are made distinct and separate through the appropriate choice of the coefficients a and b, and a and b̄, in each circuit. The outputs of each digital filter 120 and 121 can be directly compared by the coincidence detector 122 in the absence of conversion back to analog form by comparing the sign byte of the output of each filter, or by introducing two D/A converters 123 and 124, the outputs of which are coupled to the coincident detector 122 which would then comprise an analog circuit.

In all cases it is to be understood that the above described embodiments are illustrative of a small number of many possible specific detector circuits which show applications of the principles of the invention. Numerous and varied other arrangements can readily be devised in accordance with these principles by those skilled in the art without departing from the spirit and the scope of the invention.

I claim:

1. A detector for detecting the presence of selected frequency components of an input signal comprising:
   two separate signal paths each delivering an output signal;
   an input circuit operative to receive the input signal and to deliver similar signal components into each of said signal paths;
   frequency responsive means in at least one of the signal paths, the frequency responsive means having a cross-over point in its frequency characteristic, the frequency responsive means being operative to deliver output such that for input signal components having frequencies on one side of the cross-over point the output of the frequency responsive means in said one path will comprise output frequency components which are substantially in phase with the output signal components of the other path, but for input signal components having frequencies on the other side of the cross-over point the output of the frequency responsive means in said one path will comprise output frequency components which are substantially out of phase with the output signal components of the other path; and
   a coincidence circuit having two inputs respectively connected to receive the output signal components of said separate paths, the coincidence circuit being operative to compare the instantaneous phases of the output components and to generate output at a first level when said output signals components have coincident phase and to generate output at a second different level when said output signals components have non-coincident phase.

2. The detector as claimed in claim 1, wherein each input of said coincidence circuit has a preselected threshold level which must be exceeded by in phase signals connected thereto before coincidence can be detected and said first output level generated.

3. The detector as claimed in claim 1, for detecting shifts in the frequency of components of an input signal about a center frequency, said detector including in said one path a low pass filter having a cross-over frequency near said center frequency, the low pass filter having a 180° phase shift for frequencies above said cross-over frequency as compared with frequencies therebelow.

4. The detector as claimed in claim 1, for detecting shifts in the frequency of components of an input signal about a center frequency, said detector including in said one path a high pass filter having a cross-over frequency near said center frequency, the high pass filter having a 180° phase shift for frequencies below said cross-over frequency as compared with frequencies thereabove.

5. The detector as claimed in claim 1, for detecting shifts in the frequency of components of an input signal about a center frequency, said detector including in said one signal path a low-pass filter having a cross-over frequency above said center frequency, the low-pass filter having about a 180° lagging phase shift for frequencies above its cross-over, and said detector including in said other signal path a high-pass filter having a cross-over frequency below said center frequency, the high-pass filter having about a 180° leading phase shift for frequencies below its cross-over.

6. The detector as claimed in claim 1, for detecting shifts in the frequency of components of an input signal about a center frequency, said detector including in both paths a band pass filter having a predetermined cross-over frequency, the cross-over frequencies of the filters in the two paths being offset on different sides of said center frequency, and the direction and amount of offset providing in the vicinity of said center frequency a zone such that signal components whose frequencies fall within that zone will deliver output signals from the two paths whose mutual phase relationship will be reversed as compared with the mutual phase relationship of output signals from the two paths resulting from input frequency components whose frequencies fall above and below said zone.

7. The detector as claimed in claim 1, wherein said coincidence circuit comprises an AND gate and a NAND gate, each having separate inputs connected respectively to receive the output signals of the two paths, and the gates having the outputs combined in a summing circuit.

8. The detector as claimed in claim 1, wherein said coincidence circuit comprises two gate circuits each having an NPN transistor and a PNP transistor connected between a load resistor and a different source of power of opposite polarity, two amplifiers each connected to a different output signal path, one amplifier having its output connected to control the NPN transistor in one gate circuit and the PNP transistor in the other gate circuit, and the other amplifier having its output connected to control the PNP transistor in said one gate circuit and the NPN transistor in the other gate circuit, and the amplifiers being connected with such polarity as to turn on both transistors in one gate circuit when both path output signals are positive and to turn on both transistors in the other gate circuit when both path signals are negative.

9. The detector as claimed in claim 1, for detecting shifts in the frequency of components of a digital input signal about a center frequency, said detector including as said frequency responsive means digital filtering means of the type having coefficients determining the filter characteristics.

10. The detector as claimed in claim 9, wherein both signal paths include a digital filter and each digital filter has a digital output including a sign byte, and said coincidence detector is connected to receive said sign bytes at its inputs and compare said sign bytes for coincidence.

11. The detector as claimed in claim 9, wherein said signal paths deliver digital signals, and the detector further including digital-to-analog converter means in each path converting said digital signals to analog signals and delivering said converted analog signals to said coincidence circuit as the inputs thereto.

12. The detector as claimed in claim 9, wherein the digital filtering means comprises transversal filtering means.

13. The detector as claimed in claim 9, wherein the digital filtering means comprises recursive filtering means.

* * * * *